United States Patent
Fujimoto et al.

(10) Patent No.: US 10,340,817 B2
(45) Date of Patent: Jul. 2, 2019

(54) SILICON CARBIDE MOSFET INVERTER CIRCUIT

(71) Applicant: Fuji Electric Co., Ltd., Kanagawa (JP)

(72) Inventors: Takumi Fujimoto, Nagano (JP); Mikiya Chounabayashi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/124,535

(22) Filed: Sep. 7, 2018

(65) Prior Publication Data

US 2019/0115850 A1 Apr. 18, 2019

(30) Foreign Application Priority Data

Oct. 18, 2017 (JP) ................. 2017-201829

(51) Int. Cl.
*H02M 7/537* (2006.01)
*H02M 1/38* (2007.01)
*H01L 27/06* (2006.01)
*H01L 29/16* (2006.01)

(52) U.S. Cl.
CPC ........ *H02M 7/537* (2013.01); *H01L 27/0629* (2013.01); *H01L 29/1608* (2013.01); *H02M 1/38* (2013.01)

(58) Field of Classification Search
CPC ............ H02M 1/32; H02M 1/38; H02M 7/48; H02M 7/53; H02M 7/537; H01L 27/06; H01L 27/0629; H01L 29/1608
See application file for complete search history.

(56) References Cited

U.S. PATENT DOCUMENTS 8,866,342 B2 * 10/2014 Iwata ............... H02M 7/49
307/82
2016/0028224 A1 * 1/2016 Yamada ........... H02M 7/487
363/56.11

FOREIGN PATENT DOCUMENTS

EP 2903149 A1 * 8/2015 ............ H02M 7/538
JP 2006-295061 A 10/2006
JP 2013223357 * 8/2013 ............ H02M 7/48

OTHER PUBLICATIONS

Caldwell, et al. "On the driving force for recombination-induced stacking fault motion in 4H-SiC," Journal of Applied Physics 108, 044503, 2010 (Mentioned in paragraph Nos. 14 and 16 of the as-filed specification.).
Caldwell, et al. "Influence of Temperature on Shockley Stacking Fault Expansion and Contraction in SiC PiN Diodes," Journal of Electronic Materials, vol. 37, No. 5, 2008 Mentioned in paragraph Nos. 14 and 16 of the as-filed specification.).

* cited by examiner

*Primary Examiner* — Matthew V Nguyen
(74) *Attorney, Agent, or Firm* — Chen Yoshimura LLP

(57) ABSTRACT

The inverter circuit has a first silicon carbide MOSFET and a second silicon carbide MOSFET connected in series and external freewheel diodes respectively connected in anti-parallel to the first and second MOSFETs. The inverter circuit is configured such that during a deadtime when the first silicon carbide MOSFET and the second silicon carbide MOSFET are OFF and freewheeling current starts flowing, a pulse width of a transient current flowing to a built-in diode of the first silicon carbide MOSFET or a built-in diode of the second silicon carbide MOSFET is less than 2 μs.

6 Claims, 7 Drawing Sheets

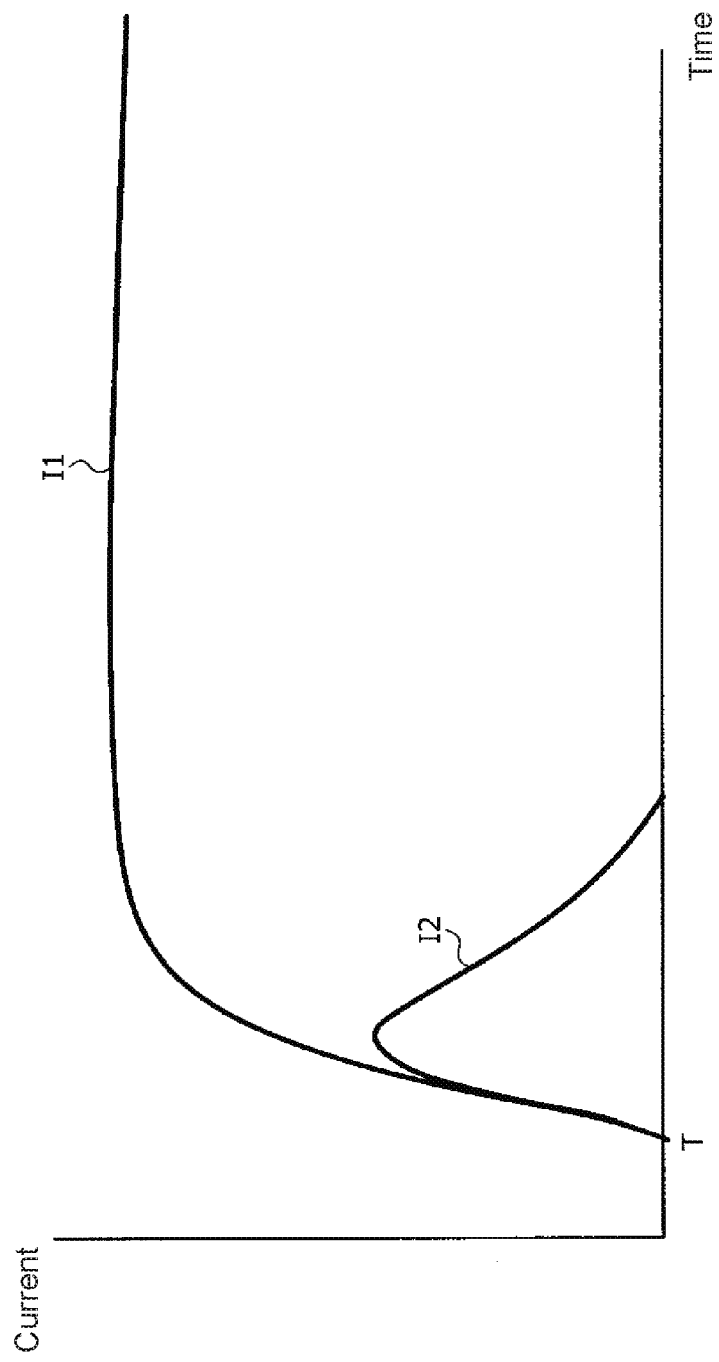

SILICON CARBIDE MOSFET INVERTER CIRCUIT

BACKGROUND OF THE INVENTION

Technical Field

This invention relates to a silicon carbide MOSFET inverter circuit.

Background Art

Silicon (Si) is conventionally used as the constituting material for power semiconductor devices, which control high voltages and large currents. There are several types of power semiconductor devices, such as bipolar transistors or IGBTs (insulated gate bipolar transistors) and MOSFETs (metal oxide semiconductor field effect transistors), each specialized for different uses.

For example, bipolar transistors or IGBTs have higher current density than MOSFETs and can have large currents, but cannot be switched at high speeds. Specifically, bipolar transistors are limited to switching frequencies of approximately several kHz, and IGBTs are limited to switching frequencies of approximately several dozen kHz. On the other hand, power MOSFETs have lower current density than bipolar transistors or IGBTs and cannot easily have large currents, but can have high-speed switching operations of up to approximately several MHz.

However, there is strong demand in the market for a power semiconductor device that has both large currents and high speed, and thus effort has been poured into improving IGBTs and power MOSFETs, to the point where development has now almost reached material limits. There has been research into semiconductor materials to replace silicon in power semiconductor devices, and silicon carbide (SiC) has gathered attention as a semiconductor material that makes possible the fabrication (manufacturing) of next-generation power semiconductor devices with excellent low ON voltage, high speed properties, and high-temperature properties.

This is due to SiC being a very chemically stable material, having a wide bandgap of 3 eV, and being possible to be used extremely stably as a semiconductor even at high temperatures. Another reason is that the maximum electric field strength for SiC is at least an order of magnitude greater than that of silicon. Due to SiC being likely to exceed the material limits of silicon, there is high anticipation for the future growth of SiC in the usage of power semiconductors, and particularly in MOSFETs. There is particular anticipation for lower ON resistance, and it can be expected for a silicon carbide MOSFET to have an even lower ON resistance while retaining high withstand voltage characteristics.

The structure of a conventional silicon carbide semiconductor device will be described while using a vertical MOSFET as an example. FIG. 5 is a cross-sectional view showing the structure of a conventional silicon carbide MOSFET. As shown in FIG. 5, an n-type silicon carbide epitaxial layer 2 is deposited on the front surface of an $n^+$ silicon carbide substrate 1, and $p^+$ base regions 3 and p-type base layers 4 are selectively provided on the surface of the n-type silicon carbide epitaxial layer 2. $N^+$ source regions 5, $p^+$ contact regions 6, and an n-type well region 7 are also selectively provided in the surface of the p-type base layer 4.

A gate electrode 9 is provided on the surface of the p-type base layer 4 and $n^+$ source regions 5 with a gate insulating film 8 interposed therebetween. A source electrode 10 is provided on the surface of the n-type silicon carbide epitaxial layer 2, $p^+$ contact region 6, and $n^+$ source region 5. A drain electrode 11 is also provided on the rear surface of the $n^+$ silicon carbide substrate 1.

A vertical MOSFET with this type of structure has a built-in parasitic pn diode formed by the $p^+$ base regions 3 and n-type silicon carbide epitaxial layer 2 as a body diode between the source and the drain. This parasitic pn diode can be operated by applying a high potential to the source electrode 10, and current flows from the $p^+$ contact region 6 in a direction toward the $n^+$ silicon carbide substrate 1 (the direction shown by the arrow A in FIG. 5) through the $p^+$ base regions 3 and n-type silicon carbide epitaxial layer 2. Thus, a MOSFET has a parasitic pn diode built in, which is different from an IGBT, and therefore it is possible to omit the freewheeling diode (FWD) used in an inverter, which contributes to lower costs and a smaller size. Hereafter, the parasitic pn diode of the MOSFET will be referred to as a built-in diode.

However, in a silicon carbide semiconductor device, there are sometimes defects in the crystals of the $n^+$ silicon carbide substrate 1. In this case, when current flows to the built-in diode, holes are injected from the $p^+$ contact regions 6, and recombination of electrons and holes occurs in the n-type silicon carbide epitaxial layer 2 or $n^+$ silicon carbide substrate 1. Recombination energy (3 eV) corresponding to the bandgap occurring at this time causes basal plane dislocations, which is one type of crystal defect existing in the $n^+$ silicon carbide substrate 1, to move and causes stacking faults interposed between two of the basal plane dislocations to expand.

When then stacking faults expand, it is difficult for current to flow through the stacking faults, and thus the ON resistance of the MOSFET and the forward voltage of the built-in diode rises. If this type of operation continues, the stacking faults will cumulatively expand, which will cause the loss occurring in the inverter circuit to increase over time, and the amount of heat generated will also increase, thus becoming a cause of device failure. In order this prevent this problem, it is possible to connect an SiC-SBD (Schottky barrier diode) in anti-parallel to the MOSFET, such that current does not flow to the built-in diode of the MOSFET.

FIG. 6 is a view showing one example of an inverter circuit using a conventional silicon carbide MOSFET. The inverter circuit is a circuit for driving a load 25 such as a motor and includes a plurality of MOSFETs (two MOSFETs 21, 22 in FIG. 6). In FIG. 6, the diodes 26, 27 respectively are the built-in diodes of the MOSFETs 21, 22. Furthermore, the diodes 30, 31 respectively show SiC-SBDs connected in anti-parallel to the MOSFETs 21, 22. In FIG. 6, only one phase of the inverter circuit, or in other words, one set of MOSFETs connected in series is shown.

In the inverter circuit shown in FIG. 6, a signal from an input circuit 34 turns ON the MOSFET 21, which allows current to flow to a load 25 in a direction from the MOSFET 21 toward the load 25 (the direction of the arrow B). Thereafter, a signal from the input circuit 34 turns OFF the MOSFET 21 and turns ON the MOSFET 22, which allows current to flow to the load 25 in a direction from the load 25 toward the MOSFET 22 (the direction of the arrow C). By changing the direction of the current in this manner, it is possible to move the arms connected to the motor of the load 25 to the left and right, for example.

When the MOSFET 21 is OFF, freewheeling current flows to the MOSFET 21 in the direction opposite to the arrow B. The freewheeling current flows to the SiC-SBD 30 that has a low threshold voltage Vf, and stops flowing to the built-in diode 26. In a similar manner for the MOSFET 22, current stops flowing to the built-in diode 27. In this manner, when the MOSFET is OFF, freewheeling current does not flow to the built-in diode, and thus stacking faults in the MOSFET do not expand anymore. Due to stacking faults not growing in the diodes 30, 31, there is no problem even if freewheeling current flows to the diodes 30, 31.

There is also a technique for shrinking the stacking faults in a MOSFET. For example, there is a technique whereby a silicon carbide bipolar semiconductor device is heated to a temperature of at least 350° C. to shrink the area of stacking faults that have expanded due to current conduction (see Patent Document 1 below). There is also a technique for suppressing the increase in forward voltage caused by triangular/belt-shaped stacking faults that have occurred in a silicon carbide semiconductor device. For example, there is a technique whereby a current of 14 A/cm$^2$ is caused to flow through a silicon carbide semiconductor device at a temperature of 242° C., thereby suppressing the forward voltage of the PN diode by 10% (see Non-Patent Document 1 below). There is also a technique for recovering forward voltage by setting a silicon carbide semiconductor device to a high temperature of 500° C., for example (see Non-Patent Document 2 below).

RELATED ART DOCUMENTS

Patent Document

Patent Document 1: Japanese Patent Application Laid-Open Publication No. 2006-295061

Non-Patent Documents

Non-Patent Document 1: Caldwell, et al. "On the driving force for recombination-induced stacking fault motion in 4H-SiC," JOURNAL OF APPLIED PHYSICS 108, 044503, 2010

Non-Patent Document 2: Caldwell, et al. "Influence of Temperature on Shockley Stacking Fault Expansion and Contraction in SiC PiN Diodes," Journal of ELECTRONIC MATERIALS, Vol. 37, No. 5, 2008

SUMMARY OF THE INVENTION

However, as shown in FIG. 6, even if the SiC-SBDs 30, 31 are connected in anti-parallel to the MOSFETs 21, 22, current sometimes flows to the built-in diodes 26, 27 of the MOSFETs 21, 22 in the instant that the MOSFETs 21, 22 switch from ON to OFF, which may expand stacking faults in the MOSFETs 21, 22. FIG. 7 is a graph showing change over time of current flowing to the diodes in the inverter circuit. In FIG. 7, the horizontal axis shows time, and the vertical axis shows current. I1 in FIG. 7 shows current flowing to the SiC-SBDs 30, 31, and I2 shows current flowing to the built-in diodes 26, 27.

FIG. 7 shows changes over time in current when the MOSFETs 21, 22 are switched from ON to OFF at time T. As shown in FIG. 7, when the MOSFETs 21, 22 turn OFF, the current I1 flowing to the SiC-SBDs 30, 31 slowly increases and settles at a fixed value. Immediately after the MOSFETs 21, 22 turn OFF, the current I2 flowing to the built-in diodes 26, 27 slowly increases during a deadtime, which will be explained below, and thereafter slowly decreases to settle at 0.

In this manner, the current I2 flowing to the built-in diodes 26, 27 is not always 0, but rather flows for a short period of time in a transient state when the MOSFETs 21, 22 switch from ON to OFF. Hereafter, this current is referred to as transient current. FIGS. 8A and 8B are graphs showing ON/OFF of the silicon carbide MOSFETs in the inverter circuit. In FIGS. 8A and 8B, the horizontal axis shows time, and the vertical axis shows voltage. FIG. 8A shows ON/OFF of the MOSFET 21 in the inverter circuit, and FIG. 8B shows ON/OFF of the MOSFET 22 in the inverter circuit. As shown in FIGS. 8A and 8B, in the inverter circuit, if the MOSFETs (MOSFETs 21 and 22 in FIG. 6) connected in series were to turn ON at the same time, short-circuiting would occur and the MOSFETs would be destroyed; thus, a deadtime is provided where the MOSFETs turn OFF at the same time. In FIGS. 8A and 8B, the period shown by t1 to t2 and the period shown by t3 to t4 are deadtimes.

Transient current flows to the built-in diodes 26, 27 during this deadtime, thus causing stacking faults to grow. The time in which transient current flows to the built-in diodes 26, 27 is short compared to the time in which the transient current does not flow, but the MOSFETs 21, 22 switch at high speeds of several MHz, for example, and thus the sum of the time in which transient current flows after long and continuous usage will become an amount that cannot be ignored. Depending on the amount of crystal defects in the silicon carbide substrate of the MOSFETs 21, 22, the transient current will cause the stacking faults to expand, thus reducing reliability of the MOSFETs 21, 22. Due to this, in order to use the MOSFETs 21, 22 with the inverter circuit, it was necessary to perform screening, prior to shipment, in which a current of the same degree as the transient current was caused to flow to the MOSFETs 21, 22 in order to select the MOSFETs 21, 22 in which stacking faults had not expanded.

In order to eliminate the problems of the conventional techniques described above, the present invention aims at providing a silicon carbide MOSFET inverter circuit capable of suppressing the expansion of stacking faults during deadtime.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a silicon carbide MOSFET inverter circuit, including: a first silicon carbide MOSFET and a second silicon carbide MOSFET connected in series, each of the first and second silicon carbide MOSFETs having a built-in diode therein; a first external freewheeling diode connected in anti-parallel to the first silicon carbide MOSFET; and a second external freewheeling diode connected in anti-parallel to the second silicon carbide MOSFET, wherein the first and second silicon carbide MOSFETs, the first and second freewheeling diodes, and wirings that interconnects the first and second silicon carbide MOSFETs and the first and second freewheeling diodes are configured such that during a deadtime in an inverter operation cycle in which the first silicon carbide MOSFET and the second silicon carbide MOSFET are both OFF, thereby causing freewheeling current to flow, a pulse width of a transient current that flows in the built-in diode of the first silicon carbide MOSFET or the built-in diode of the second silicon carbide MOSFET in response to the freewheeling current during the deadtime is less than 2 µs.

In another aspect, the present disclosure provides a method for driving a load using a silicon carbide MOSFET inverter circuit connected to the load, the silicon carbide MOSFET inverter circuit including: a first silicon carbide MOSFET and a second silicon carbide MOSFET connected in series, each of the first and second silicon carbide MOSFETs having a built-in diode therein; a first external freewheeling diode connected in anti-parallel to the first silicon carbide MOSFET; and a second external freewheeling diode connected in anti-parallel to the second silicon carbide MOSFET, wherein the first and second silicon carbide MOSFETs, the first and second freewheeling diodes, and wirings that interconnects the first and second silicon carbide MOSFETs and the first and second freewheeling diodes are configured such that during a deadtime in an inverter operation cycle in which the first silicon carbide MOSFET and the second silicon carbide MOSFET are both OFF, thereby causing freewheeling current to flow, a pulse width of a transient current that flows in the built-in diode of the first silicon carbide MOSFET or the built-in diode of the second silicon carbide MOSFET in response to the freewheeling current during the deadtime is less than 2 µs, the method including: turning ON the first silicon carbide MOSFET while the second silicon carbide MOSFET is turned OFF; thereafter, turning OFF the first silicon carbide MOSFET, thereby starting the deadtime; and thereafter, turning ON the second silicon carbide MOSFET less than 2 µs after the deadtime has started so that the deadtime lasts less than 2 µs.

Furthermore, in regard to the silicon carbide MOSFET inverter circuit according to the above aspects of the present invention, the first and second silicon carbide MOSFETs, the first and second freewheeling diodes, and the wirings that interconnects the first and second silicon carbide MOSFETs and the freewheeling diodes are configured such that a current density of the transient current may be 100 A/cm² or less, and the pulse width of the transient current may be 0.4 µs or less.

Furthermore, the silicon carbide MOSFET inverter circuit according to the above aspects of the present invention may further include: a first diode connected in anti-parallel to the first silicon carbide MOSFET; and a second diode connected in anti-parallel to the second silicon carbide MOSFET.

Furthermore, in regard to the silicon carbide MOSFET inverter circuit according to the above aspects of the present invention, the deadtime may be 2 µs or less.

Furthermore, in regard to the silicon carbide MOSFET inverter circuit according to the above aspects of the present invention, the pulse width t of the transient current and a current density I of the transient current may satisfy: $0.5 \times 10^{-2} \times I/\exp(-t \times 1.7 \times 10^6) \leq 1$.

According to the invention described above, the inverter circuit with the silicon carbide MOSFETs can shorten the pulse width of transient current flowing to the built-in diodes during deadtime. This makes it possible to suppress the growth of stacking faults in the MOSFETs and to prevent degradation of the characteristics of the inverter circuit in the silicon carbide semiconductor device.

The silicon carbide MOSFET inverter circuit according to the present invention exhibits effects whereby it is possible to suppress the expansion of stacking faults during deadtime.

It is to be understood that both the foregoing general description and the following detailed description are exemplary and explanatory, and are intended to provide further explanation of the invention as claimed.

BRIEF DESCRIPTION OF THE DRAWINGS

FIG. 7 is a graph showing change over time of a current flowing to a diode in the inverter circuit.

DETAILED DESCRIPTION OF EMBODIMENTS

Figure 1:
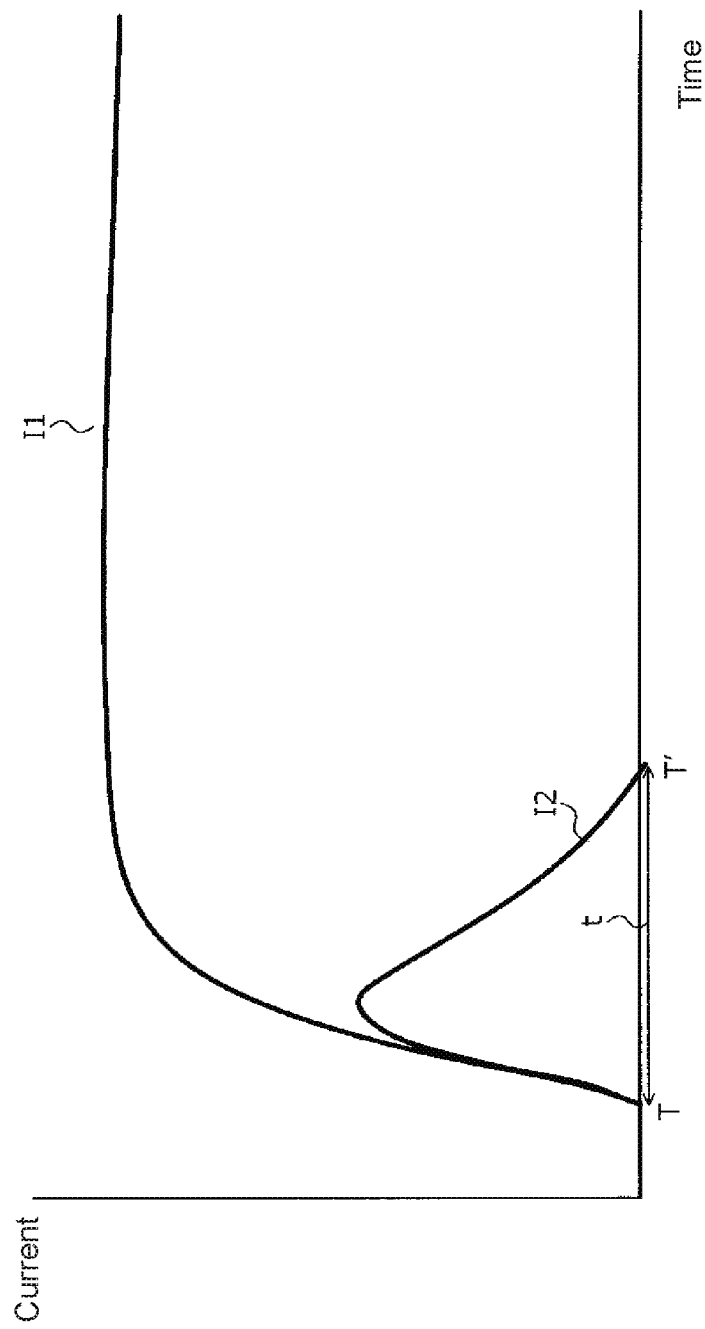
FIG. 1 is a graph showing change over time of current flowing to a built-in diode of a silicon carbide MOSFET in an embodiment.

A preferable embodiment of a silicon carbide MOSFET inverter circuit according to the present invention will be explained in detail below with reference to the attached drawings. In the present specification and attached drawings, electrons or holes are respectively majority carriers in layers or areas marked with an "n" or "p". The "+" or "−" attached to the "n" or "p" respectively signify higher impurity concentrations and lower impurity concentrations than layers or areas without these symbols. In the explanation of the embodiments below and the attached drawings, the same reference characters are attached to similar configurations and repetitive descriptions will be omitted.

Embodiment

Figure 5:
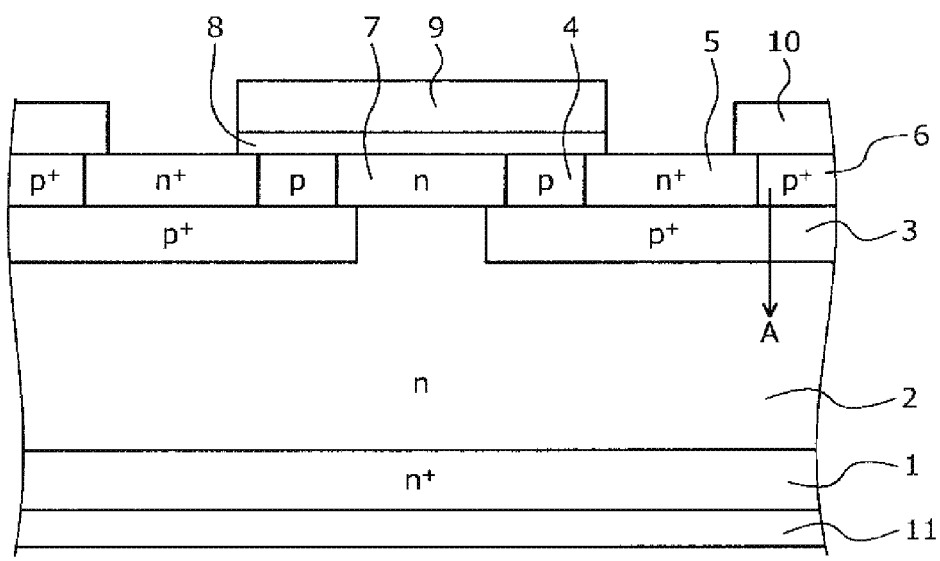
FIG. 5 is a cross-sectional view showing the structure of a conventional silicon carbide MOSFET.

The configuration of the silicon carbide MOSFET of this embodiment is similar to the configuration of a conventional silicon carbide semiconductor device, and thus a disclosure and description thereof will be omitted. The conventional silicon carbide semiconductor device described in FIG. 5 was a planar structure silicon carbide MOSFET in which the channel is formed parallel to the substrate surface, but the present invention can be applied to a vertical MOSFET having a trench structure in which the channel is formed in a direction perpendicular to the substrate surface, for example. The present invention can be applied to a silicon carbide MOSFET used in an inverter circuit.

Figure 6:
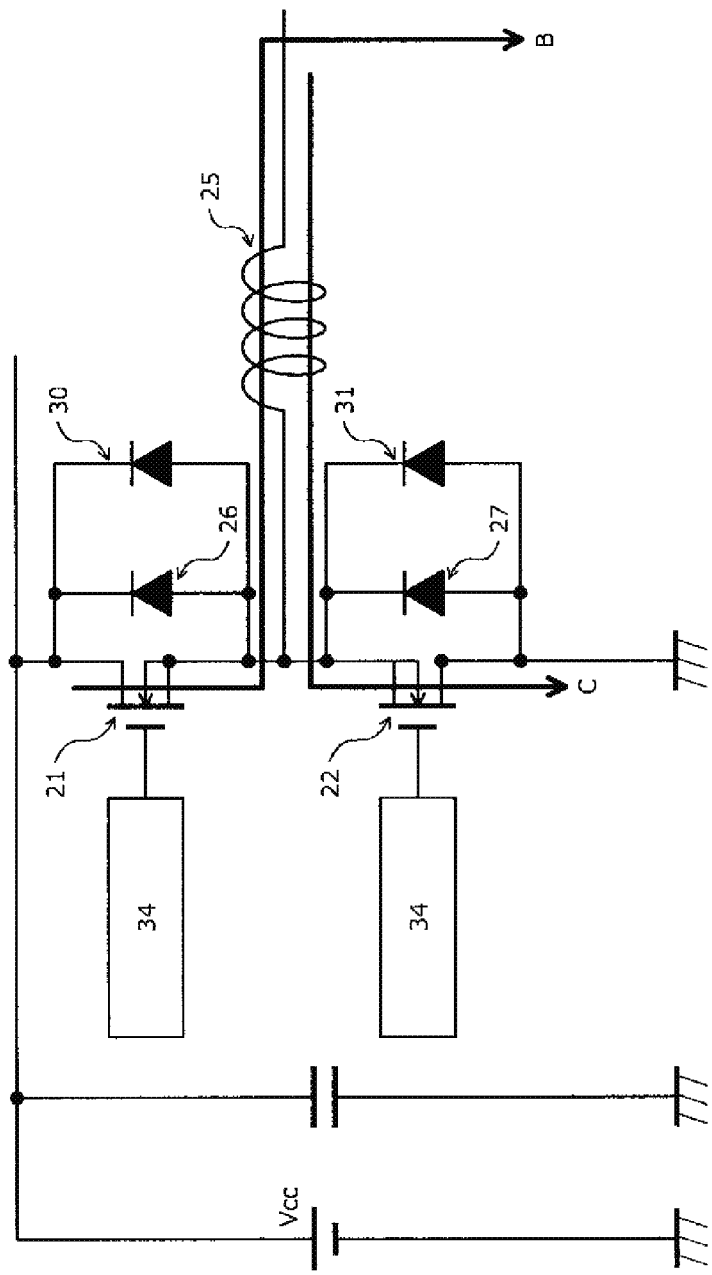
FIG. 6 is a view showing one example of an inverter circuit using the conventional silicon carbide MOSFETs.
Figure 8A:
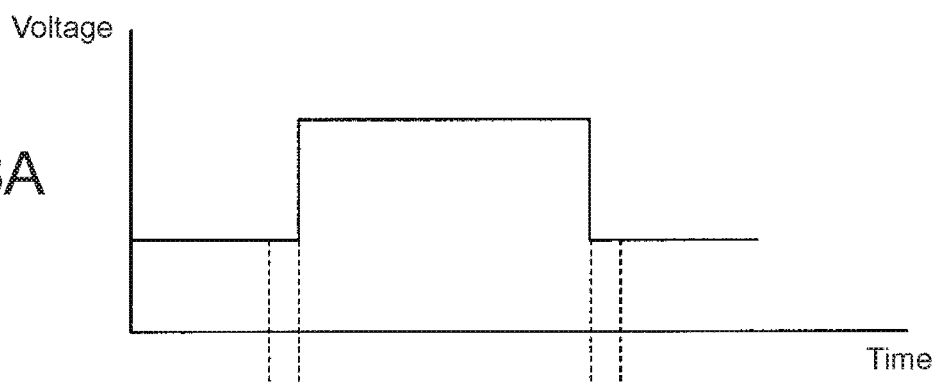
FIG. 8A is a graph showing ON/OFF of a silicon carbide MOSFET 21 in the inverter circuit.
Figure 8B:
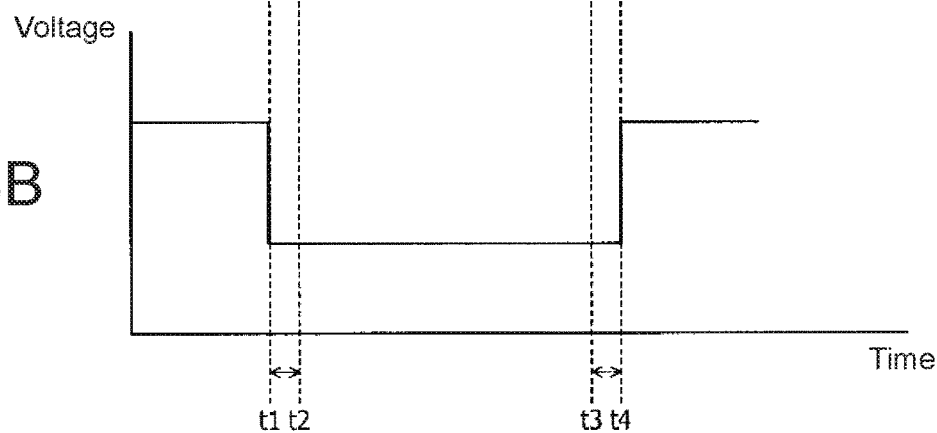
FIG. 8B is a graph showing ON/OFF of a silicon carbide MOSFET 22 in the inverter circuit.

Furthermore, the configuration of the silicon carbide MOSFET inverter circuit of this embodiment is similar to the configuration of a conventional silicon carbide MOSFET inverter circuit (shown in FIG. 6), and thus a disclosure thereof will be omitted. In the silicon carbide MOSFET inverter circuit of this embodiment, the pulse width of transient current flowing to the built-in diodes during deadtime and the current density of the transient current are defined. For example, by lowing inductance through shortening the wiring of the inverter circuit or the like, it is possible to shorten the pulse width of the transient current.

FIG. 1 is a graph showing change over time of current flowing to a built-in diode of a silicon carbide MOSFET in this embodiment. In FIG. 1, the horizontal axis shows time, and the vertical axis shows current. I1 in FIG. 1 shows current flowing to the SiC-SBD, and I2 shows current flowing to built-in diodes of the silicon carbide MOSFETs.

FIG. 1 shows changes over time in current when the MOSFET is switched from ON to OFF at time T. As shown in FIG. 1, when the MOSFET turns OFF, transient current of a pulse width t of a short pulse of e.g. 0.2 μs to 1.0 μs flows to the built-in diode of the silicon carbide MOSFET. The pulse width of the transient current is a time T'−T where the current value increases from a time T at which the current value is 0 and thereafter decreases until a time T' at which the current value becomes 0. In FIG. 1, the pulse width of the transient current is the time shown by the reference character t.

Hereinafter, specific examples of the pulse width and current density of the transient current of the built-in diodes of the silicon carbide MOSFETs of this embodiment will be described in detail along with the effects etc. of defining the pulse width and current density of the transient current.

Figure 2:
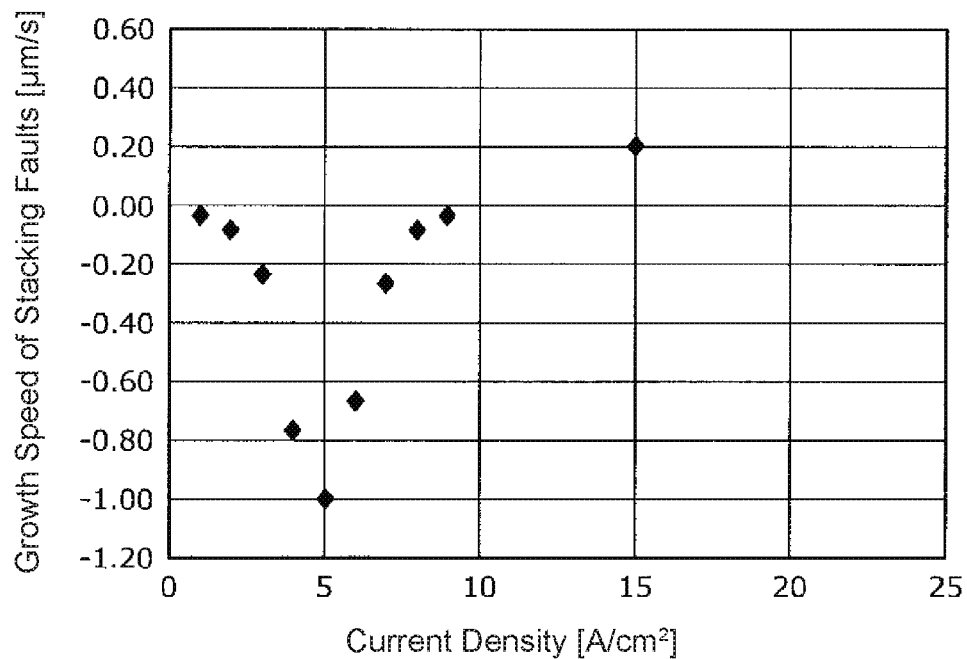
FIG. 2 is a graph showing the growth speed of stacking faults relative to current density of a silicon carbide MOSFET.

FIG. 2 is a graph showing the growth speed of stacking faults relative to current density of a silicon carbide MOSFET. In FIG. 2, the vertical axis shows the growth speed of stacking faults in units of μm/s, and the horizontal axis shows current density in units of $A/cm^2$. The growth speed of the stacking faults is the speed at which belt-shaped stacking faults extend inside the silicon carbide semiconductor substrate. FIG. 2 is test results from causing a direct current to flow to the silicon carbide semiconductor device and then measuring the growth speed of the stacking faults relative to the current density of the direct current.

As shown in FIG. 2, as the current density of the direct current becomes greater from around 10 $A/cm^2$, the stacking faults grow. Meanwhile, when the current density of the direct current becomes less than 10 $A/cm^2$, the growth speed of the stacking faults is negative, and the stacking faults shrink. In other words, stacking faults do not grow with a direct current having a current density of less than 10 $A/cm^2$ in the silicon carbide semiconductor device.

Figure 3:
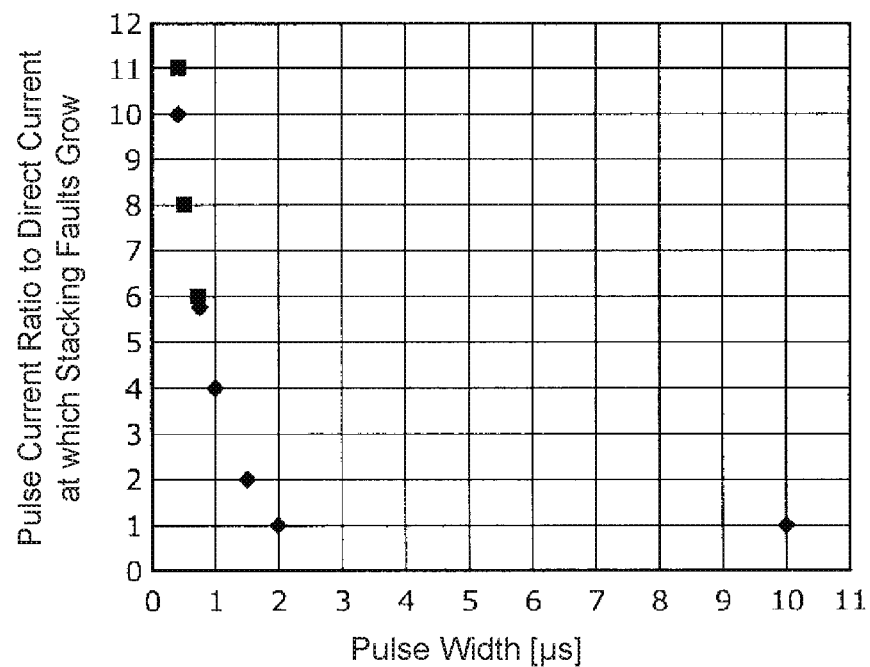
FIG. 3 is a graph showing the ratio of direct current at which stacking faults grow relative to a pulse width of a pulse current.

Next, FIG. 3 is a graph showing the ratio of pulse current to direct current at which stacking faults grow as a function of the pulse width of the pulse current. In FIG. 3, the vertical axis shows the pulse current ratio to direct current at which stacking faults grow relative to the pulse width of the pulse current, and the horizontal axis shows the pulse width of the pulse current in units of μs. Pulse current is current for which the current value increases during a prescribed time and then decreases to 0. For example, the transient current I2 flowing to the built-in diodes is one type of pulse current. Furthermore, similar to the pulse width of the transient current, the pulse width of the pulse current is a time T'−T where the current value increases from a time T at which the current value is 0 and thereafter decreases until a time T' at which the current value becomes 0. FIG. 3 shows results from causing a pulse current to flow to the silicon carbide semiconductor device, measuring the growth speed of stacking faults relative to the pulse width of the pulse current, and calculating the ratio relative to the current density of the direct current.

As shown in FIG. 3, when the pulse width of the pulse current becomes smaller, the ratio becomes greater than 1. This means that as the pulse width of the pulse current becomes smaller, the amount of current necessary to cause stacking faults to grow becomes greater. In other words, even at a greater current density, stacking faults will not grow. This result is estimated to be because the pulse width becoming smaller shortens the time in which current is flowing and a smaller number of carriers (holes) of the built-in diode reach the silicon carbide semiconductor substrate.

Specifically, as shown in FIG. 3, when the pulse width of the pulse current is 2 μs or above, the ratio is 1. In other words, even with a pulse current, stacking faults grow at the same current density as a direct current. When taking FIG. 2 into consideration, in a pulse current with a pulse width of 2 μs or above, stacking faults will grow if the current density is greater than 10 $A/cm^2$.

Meanwhile, if the pulse width of the pulse current is less than 2μ, the ratio will become greater than 1. In other words, with a pulse current, stacking faults do not grow even if the current density is greater than a direct current. For example, if the pulse width is 1 μs, then the ratio is 4, and stacking faults do not grow even at a current density that is four times than a direct current. When taking FIG. 2 into consideration, in a pulse current with a pulse width of 1 μs, stacking faults will not grow until the current density becomes 40 $A/cm^2$, which is four times the current density of 10 $A/cm^2$.

Furthermore, for example, if the pulse width is 0.2 μs, the ratio is 10 or more, and stacking faults do not grow even at a current density that is ten times or more than a direct current. When taking FIG. 2 into consideration, in a pulse current with a pulse width of 0.2 μs, stacking faults will not grow until the current density becomes 100 $A/cm^2$ or more, which is ten times the current density of 10 $A/cm^2$.

Figure 4:
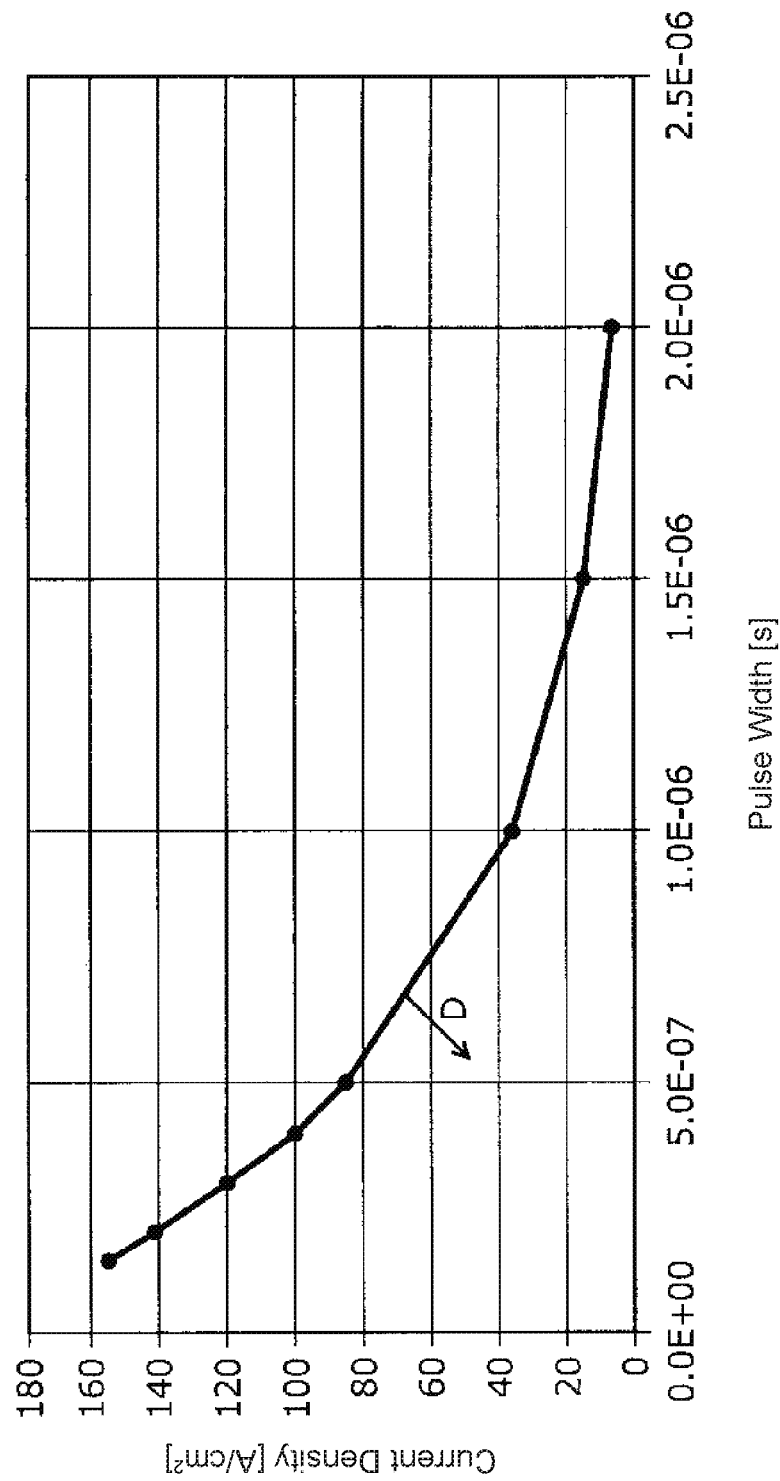
FIG. 4 is a graph showing current density at which stacking faults grow relative to a pulse width of a pulse current.

Next, FIG. 4 is a graph showing current density at which stacking faults grow relative to the pulse width of the pulse current. In FIG. 4, the vertical axis shows the current density at which stacking faults grow in units of $A/cm^2$, and the horizontal axis shows the pulse width of the pulse current in units of s. FIG. 4 shows results calculated from FIG. 2 and FIG. 3, and when the pulse width is defined as t, and the current density as I, then the curved line in FIG. 4 can be expressed with:

$$I = 200 \times \exp(-t \times 1.7 \times 10^6) \qquad (1)$$

The area more on the origin side of this curved line, i.e., the area on the arrow D side, is expressed as:

$$0.5 \times 10^{-2} \times I / \exp(-t \times 1.7 \times 10^6) \leq 1 \qquad (2)$$

Stacking faults do not grow with a pulse width t and current density I satisfying expression (2).

A summary of these results is as follows. When the pulse width of the pulse current is 1 μs, stacking faults do not grow until the current density of the pulse current reaches a current density of 40 $A/cm^2$, thus inhibiting the growth of stacking faults. Furthermore, a pulse width of a pulse current of 0.4 μs and a current density of 100 $A/cm^2$ or less can prevent stacking faults from growing. More generally, a pulse width and a current density of a pulse current satisfying expression (2) can prevent stacking faults from growing.

Due to the above, the inverter circuit with the silicon carbide MOSFETs of this embodiment has a pulse width of transient current that is less than 2 μs. A case will be explained with the transient current as pulse current. In this case, even with a current density greater than with a direct current, stacking faults can be prevented from growing. For example, with the inverter circuit with the silicon carbide MOSFETs of this embodiment, if the pulse width of the transient current is set to 1 μs, then stacking faults will not grow until the transient current reaches a current density of 40 A/cm². As described above, the relationship between pulse width and current density always satisfies the relationship in FIG. 4 (the relationship of expression (1)), and thus, if it is possible to use the MOSFETs up to a current density of 10 A/cm² with a pulse width of at least 2 μs and with direct current, then it is possible to use the MOSFETs up to a current density of 40 A/cm² with a pulse width of 1 μs. Therefore, for the product specification, in a MOSFET that can be used up to a freewheeling current of 40 A/cm², it is sufficient to have screening in which a direct current with a current density of 10 A/cm² is caused to flow to the MOSFETs prior to shipment to select the MOSFETs in which stacking faults do not expand. This is because in the case of a pulse width of 1 μs, even with a current density four times greater than a direct current, stacking faults do not grow. Due to this, screening is performed with fewer conditions at 10 A/cm², rather than 40 A/cm², and thus the number of defective products decreases and yield increases, making it possible to lower costs. Furthermore, testing with a pulse current requires that the silicon carbide MOSFETs be installed in the inverter circuit, but testing with a direct current can be done with the silicon carbide MOSFETs alone, and thus it is also possible to reduce the steps for testing.

In the inverter circuit with the silicon carbide MOSFETs of this embodiment, it is preferable that the pulse width of the transient current be set to 0.4 μs or below, and further preferable that the density current of the transient current be set to 100 A/cm² or below. With these settings, it is possible to prevent stacking faults from growing. In this case, for MOSFETs that can be used up to a freewheeling current of 100 A/cm² as the product specification, for the reasons similar to when the pulse width is 1 μs, it is sufficient to perform screening whereby, prior to shipment, a direct current having a current density of 10 A/cm² is caused to flow to the MOSFETs, and the MOSFETs in which stacking faults do not grow are selected. This is because in the case of a pulse width of 0.4 μs, even with a current density ten times greater than a direct current, stacking faults do not grow. Due to this, screening is performed with fewer conditions at 10 A/cm², rather than at 100 A/cm², and thus the number of defective products decreases and yield increases, making it possible to lower costs.

More generally, in the inverter circuit with the silicon carbide MOSFETs of this embodiment, it is preferable that the pulse width t of the transient current and the current density I of the transient current satisfy the conditions in expression (2). With these settings, it is possible to prevent stacking faults from growing. In this case as well, for similar reasons to above, the screening is performed at 10 A/cm² with fewer conditions, and thus the number of defective products decreases and yield increases, making it possible to lower costs.

It is preferable that the deadtime of the inverter circuit with the silicon carbide MOSFETs in this embodiment be 2 μs or less. If the deadtime becomes greater than the pulse width of the transient current, the two MOSFETs of the inverter circuit will turn ON at the same time, and thus it is necessary for the pulse width to be shorter than the deadtime. By setting the pulse width of the transient current to less than 2 μs, it is possible to also set the deadtime to 2 μs or less in a range not exceeding the pulse width. For example, the deadtime can be set to 300 ns to 800 ns. By so doing, even if the current density of the transient current increases and the conditions for the growth of crystal defects are met (in a case in which expression (2) above is not satisfied), the time in which the transient current flows is short, which can suppress the growth of the crystal defects.

In this embodiment, the diodes connected to the silicon carbide MOSFETs can be SiC-SBDs or Si-SBDs. SiC-SBDs are more preferable for heat resistance of the inverter device. It is also possible to use PN diodes instead of SBDs. If diodes are not connected to the silicon carbide MOSFETs, the freewheeling current after the transient current will flow to the silicon carbide MOSFETs, and thus it is preferable that the diodes be connected to the MOSFETs.

As described above, the inverter circuit with the silicon carbide MOSFETs according to this embodiment shortens the pulse width of a transient current flowing to build-in diodes during deadtime. This makes it possible to suppress the growth of stacking faults in the MOSFETs and to prevent degradation of the characteristics of the inverter circuit in the silicon carbide semiconductor device.

Various modifications can be made to the present invention described above without departing from the spirit of the present invention. For example, in the respective embodiments above, the dimensions, impurity concentrations, etc. of the respective parts can be modified in accordance with the desired specifications or the like. Moreover, in the respective embodiments described above, an example is described in which silicon carbide was used as the wide bandgap semiconductor, but the present invention is also applicable to wide bandgap semiconductors other than silicon carbide, such as gallium nitride (GaN). In addition, in the embodiments described above, the first conductivity type is n-type, and the second conductivity type is p-type, but the present invention is applicable even when the first conductivity type is p-type and the second conductivity type is n-type.

INDUSTRIAL APPLICABILITY

As described above, the inverter circuit of the silicon carbide MOSFETs according to the present invention is useful for a power supply device or the like, such as various types of industrial machinery or a power converter using an inverter circuit in which diodes are connected in anti-parallel to silicon carbide MOSFETs.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:
1. A silicon carbide MOSFET inverter circuit, comprising:
    a first silicon carbide MOSFET and a second silicon carbide MOSFET connected in series, each of the first and second silicon carbide MOSFETs having a built-in diode therein;
    a first external freewheeling diode connected in anti-parallel to the first silicon carbide MOSFET; and
    a second external freewheeling diode connected in anti-parallel to the second silicon carbide MOSFET,
    wherein the first and second silicon carbide MOSFETs, the first and second freewheeling diodes, and wirings that interconnects the first and second silicon carbide MOSFETs and the first and second freewheeling diodes are configured such that during a deadtime in an inverter operation cycle in which the first silicon carbide MOSFET and the second silicon carbide MOSFET are both OFF, thereby causing freewheeling current to flow, a pulse width of a transient current that flows in the built-in diode of the first silicon carbide MOSFET or the built-in diode of the second silicon carbide MOSFET in response to the freewheeling current during the deadtime is less than 2 µs.

2. The silicon carbide MOSFET inverter circuit according to claim 1, wherein the first and second silicon carbide MOSFETs, the first and second freewheeling diodes, and the wirings that interconnects the first and second silicon carbide MOSFETs are configured such that a current density of the transient current is 100 A/cm$^2$ or less, and the pulse width of the transient current is 0.4 µs or less.

3. The silicon carbide MOSFET inverter circuit according to claim 1, wherein the pulse width t of the transient current and a current density I of the transient current satisfies: $0.5 \times 10^{-2} \times I/\exp(-t \times 1.7 \times 10^6) \leq 1$.

4. A method for driving a load using a silicon carbide MOSFET inverter circuit connected to the load, the silicon carbide MOSFET inverter circuit including: a first silicon carbide MOSFET and a second silicon carbide MOSFET connected in series, each of the first and second silicon carbide MOSFETs having a built-in diode therein; a first external freewheeling diode connected in anti-parallel to the first silicon carbide MOSFET; and a second external freewheeling diode connected in anti-parallel to the second silicon carbide MOSFET, wherein the first and second silicon carbide MOSFETs, the first and second freewheeling diodes, and wirings that interconnects the first and second silicon carbide MOSFETs and the first and second freewheeling diodes are configured such that during a deadtime in an inverter operation cycle in which the first silicon carbide MOSFET and the second silicon carbide MOSFET are both OFF, thereby causing freewheeling current to flow, a pulse width of a transient current that flows in the built-in diode of the first silicon carbide MOSFET or the built-in diode of the second silicon carbide MOSFET in response to the freewheeling current during the deadtime is less than 2 µs, the method comprising:
  turning ON the first silicon carbide MOSFET while the second silicon carbide MOSFET is turned OFF;
  thereafter, turning OFF the first silicon carbide MOSFET, thereby starting the deadtime; and
  thereafter, turning ON the second silicon carbide MOSFET less than 2 µs after the deadtime has started so that the deadtime lasts less than 2 µs.

5. The method according to claim 4, wherein the first and second silicon carbide MOSFETs, the first and second freewheeling diodes, and the wirings that interconnects the first and second silicon carbide MOSFETs and the freewheeling diodes are configured such that a current density of the transient current is 100 A/cm$^2$ or less, and the pulse width of the transient current is 0.4 µs or less.

6. The method according to 4, wherein the pulse width t of the transient current and a current density I of the transient current satisfies: $0.5 \times 10^{-2} \times I/\exp(-t \times 1.7 \times 10^6) \leq 1$.

* * * * *